United States Patent [19]

Levy

[11] Patent Number: 4,696,032
[45] Date of Patent: Sep. 22, 1987

[54] VOICE SWITCHED GAIN SYSTEM

[75] Inventor: Allan Levy, Delray Beach, Fla.

[73] Assignee: Siemens Corporate Research & Support, Inc., Iselin, N.J.

[21] Appl. No.: 705,935

[22] Filed: Feb. 26, 1985

[51] Int. Cl.[4] .......................... H04M 9/08; H04R 3/06
[52] U.S. Cl. .................................... 379/390; 381/113; 333/17 R; 333/14
[58] Field of Search ......... 179/107 FD, 81 B, 84 VF, 179/170.2, 170.6, 107 R, 107 E, 111 E; 381/106, 107, 111, 96, 113, 155, 174, 190; 379/390, 399, 388, 406; 333/17 R, 17 L, 14

[56] References Cited

U.S. PATENT DOCUMENTS

| | | | |
|---|---|---|---|
| 3,610,835 | 10/1971 | Reid | 179/81 B |
| 3,730,995 | 5/1973 | Mathews | 381/110 |
| 3,751,602 | 8/1973 | Breeden | 179/81 B |
| 3,735,290 | 5/1973 | Yamazaki | 333/14 |
| 3,846,719 | 11/1974 | Dolby | 333/14 |
| 3,975,588 | 8/1976 | Besseyre et al. | 179/170.2 X |
| 4,056,696 | 9/1976 | Meyerle et al. | 179/100 R |
| 4,237,339 | 10/1978 | Bunting et al. | 179/18 BC |
| 4,287,391 | 10/1981 | Queen | 381/107 |
| 4,455,675 | 6/1984 | Bose et al. | 381/74 |
| 4,496,799 | 1/1985 | Kingen et al. | 179/100 L |
| 4,542,263 | 9/1985 | Mituni | 179/81 B |
| 4,548,082 | 10/1985 | Engebretson et al. | 73/585 |
| 4,560,840 | 12/1985 | Hansen | 179/81 B |

OTHER PUBLICATIONS

Markline catalog, P.O. Box C-5, Belmont, MA, 02178, Spring 1985, p. 3.
Signetics Analog Data, Jun., 1983, pp. 5-3 through 5-9.

Primary Examiner—Gene Z. Rubinson
Assistant Examiner—R. Vaas
Attorney, Agent, or Firm—Adel A. Ahmed; Thomas H. Jackson

[57] ABSTRACT

A voice switched gain system is disclosed for loudspeaking telephone and hearing aid applications involving electret microphones. A voice switched gain circuit comprises an audio pre-conditioning circuit for providing a conditioned audio input referenced to an unconditioned audio input to a compandor circuit. A linear gain level reference generator circuit generates a level for comparison with the audio input level. A decision circuit then controls the compandor operation based on the result of the comparison. The decision circuit either maintains the audio output of the compandor in a compressed state or expands the audio input signal to a higher level expanded state for transmission. Two such circuits are provided in a loudspeaking telephone system, one circuit for maintaining a preemptive near end control through appropriate timing of the dual decision process. Far end control is provided by the other voice switched gain circuit. Altogether three states of operation are possible, an idle state, near end control and far end control. In one embodiment, a dial preemption circuit is disclosed so that during dialing the loudspeaking telephone only broadcasts dialing signals.

6 Claims, 2 Drawing Figures

VOICE SWITCHED GAIN SYSTEM

BACKGROUND OF THE INVENTION

1. Technical Field

This invention relates to the field of audio reception and transmission systems generally and, more particularly, to the field of voice switched gain systems for loudspeaking telephone or hearing aid applications involving electret microphones.

2. Description of the Prior Art

It is recognized in the art of loudspeaking telephones and voice conferencing arrangements that background noise is undesirable and can present a situation where intelligible audio control may be easily lost to the noise source. The noise itself should be cancelled or eliminated. On the other hand, switching of control from near end to far end or from audio source to audio source should be smooth and free of chopping as, for example, when whole first syllables of a word spoken may be lost due to a slow switching process. As a result of the development of the electret microphone, a smooth, linear, highly reliable gain characteristic is achievable in such applications, but telephone engineers have been generally reluctant to implement electret devices in such applications because the gain characteristic was likewise applied to noise as to desirable voice.

Matthews, in U.S. Pat. No. 3,730,995, discloses a Voice Controlled Microphone Control System including a speech detection circuit and relay arrangement for preempting control of a conference. When speech above a particular level is detected, a relay is operated and a signal is generated which precludes transmission by other microphones of the system so long as the speech level exceeds the particular reference level. No solution is suggested for dealing with background noise problems, however.

The Loudspeaking Telephone disclosed by Breeden in U.S. Pat. No. 3,751,602 tackles timing problems of gain switching and introduces two modes of operation—a transmit or a receive mode where the mode is changed when sufficient audio level is detected from the non-controlling source. Little concern is given to background noise which still can take control of the Breeden telephone. Furthermore, with changes in background noise level, the party who desires control always wonders if they really have control or whether their transmission has been interrupted by noise at the far end.

In Reid, U.S. Pat. No. 3,610,835, a loudspeaking telephone is disclosed which includes a variable impedance device for increasing loss when a translated received noise is greater than a translated received speech signal. This means of dealing with a noise source at the near end does not take into consideration the characteristic gain of electret microphone devices and encourages the near end user to shout to preempt control form the noise source. Also in Reid, there is always a default direction of transmission or controlling end, namely the near or receive end, but usually the near end, which is only switched from when control is taken by the far end. In this arrangement, the far end sounds dead during idle periods to the near end.

SUMMARY OF THE INVENTION

The present invention solves the problems that remain unsolved by the prior art by reducing the transmission gain in both directions of transmission when the system is idle. In other words, the present invention creates three states of operation including a first state of operation where both the microphone and loudspeaker at the near end of the transmission channel are switched off during periods when neither party is speaking.

With the present arrangement, neither party is made aware of background room noise during idle periods in the conversation. Consequently, there is no objectionable, apparently sudden deadness of the loudspeaker, leading a person to believe that transmission has been interrupted.

As a subsidiary feature of the invention, a small amount of artificially generated noise may be provided to the loudspeaker to simulate a "live" line during idle periods.

The present invention also eliminates the objectionable chopping of the first spoken syllable of a word because, with the reduced gain in both directions, faster switching action can be achieved. With the present invention, the first party speaking after an idle period takes command of the system, and the speech picked up by their microphone is immediately transmitted to the other party.

Another advantage of the present invention is its design which takes advantage of the superior gain characteristics of electret microphones to provide a true audio signal. Distortion above a particular reference level of audio input is eliminated, and there is no transmission of noise input below the reference level. As suggested above, its first or idle state of operation permits a normally noise-free transmission channel. This is the characteristic of the present invention that appears to be particularly suited for hearing aid application. A hearing aid user in an environment having a relatively high ambient noise level would be normally free from having to listen to such noise but due to rapid voice switching could respond quickly to intelligible audio. During a musical concert, the hearing aid user could enjoy a full audio range from the electret enhanced by a compensation circuit adapted to the user's particular hearing loss characteristic. These and other features of the present invention will become apparent from a reading of the following detailed description of an illustrative embodiment as depicted in the drawings.

DETAILED DESCRIPTION

Figure 1:
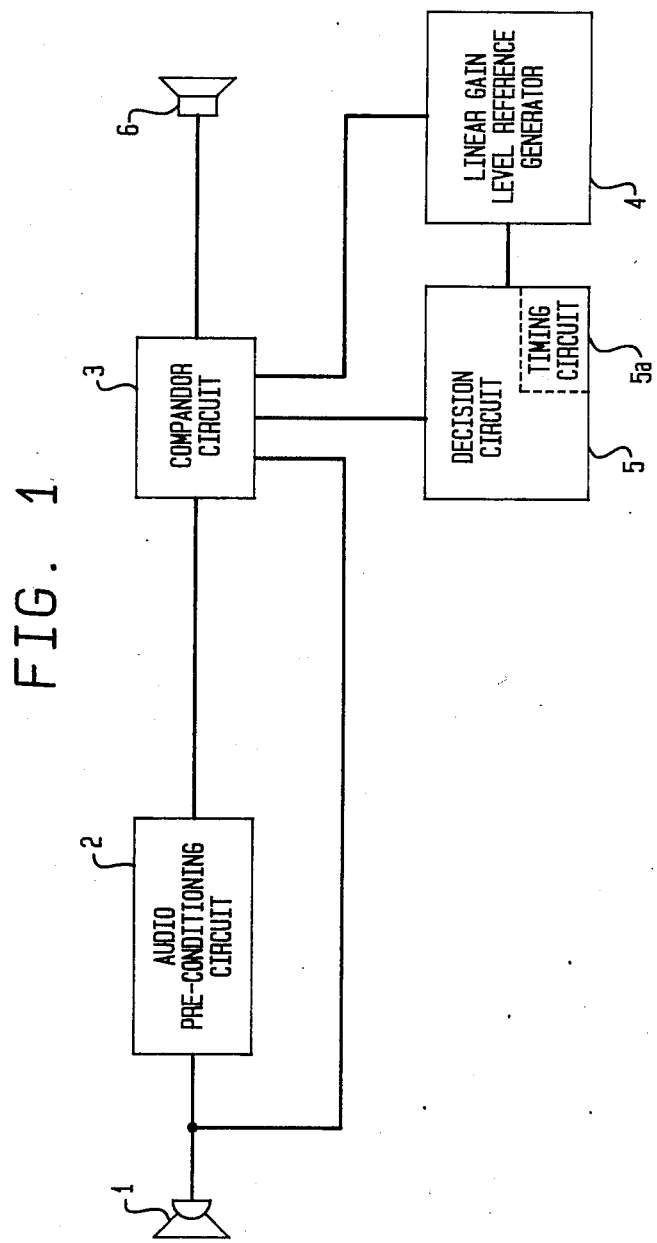
FIG. 1 is a block schematic drawing showing the composition of a simplified embodiment of the present invention for application with one microphone and loudspeaker.

Referring more particularly to FIG. 1, there is shown an electret microphone circuit 1 comprising a preamplifier circuit for providing an audio input directly to a compandor circuit 3 and also to an audio preconditioning circuit 2 for the compandor circuit. The present voice switched gain system also comprises a linear gain level reference generator 4 for providing a reference gain level to a decision circuit 5 for actuating the compandor circuit 3. The output of the compandor circuit is provided to loudspeaker 6.

Also associated with decision circuit 5 is a timing circuit 5a for establishing an attack time by which time a decision is made to actuate an expansion of the gain characteristic audio input of compandor 3 as well as a delay or lag time by which time a decision is made at the termination of audio input signal to actuate a compression of the gain characteristic audio input to the compandor.

This simplified block digram may be implemented as follows. A low power operational amplifier may be used to pre-condition the audio input. The output of the pre-conditioning circuit as well as the audio input from microphone circuit 1 provide a change in gain characteristic through direct current blocking capacitors to compandor 3. Compandor 3 is most conveniently a very large scale integrated circuit designed compandor chip such as a Signetics model 571 compandor. Such a compact chip embodiment permits application in a hearing aid. Application of the model 571 compandor chip is more particularly described in the Signetics Corporation publication, "Analog Data Manual 1983", June, 1983, at pages 5—3 through 5-9.

The compander chip comprises two separate gain circuits. Each gain circuit comprises, in series combination, a variable gain cell, an operational amplifier and a bias system for biasing their operation, all of which operate in a well known manner. Of importance to the present invention, however, is a so-called THD trim terminal of each variable gain cell. The terminal permits a nulling of internal offsets for low distortion operation. All pin assignments shown in FIG. 2 relate to those shown in the Signetics Analog Data Manual.

The decision circuit 5 most conveniently may comprise a low power operational amplifier used as a comparator for operation with a switching transistor. The emitter and collector of the transistor are connected to the terminals of the linear gain level reference generator which may simply be an appropriately chosen Zener diode.

Timing circuits for establishing attack and lag times may be constructed of an appropriate choice of a resistor and capacitor network. A timing circuit is most conveniently placed in series between the operational amplifier and the base of the switching transistor of the decision circuit 5. If necessary, an audio loss compensation circuit, not shown, may be added between the compandor output and the speaker, designed into the compandor, or provided in the preconditioning circuit in a hearing air application. The audio loss compensation circuit would be provided to compensate for the unique hearing loss characteristic of the hearing air user.

The circuit of FIG. 1 simply operates as follows. In its normally idle or first state, or when there is no audio output provided by microphone circuit 1, the compandor 3 provides a compressed gain characteristic to loudspeaker 6. When an audio input is provided at a lower level than is provided by reference generator 4, the circuit remains in its idle state of operation and the compandor continues to present a compressed gain characteristic output from the presented audio input.

When the audio input level exceeds the level presented by generator 4, decision circuit 5 operates within the attack time of supplemental timing circuit 5a to actuate an expansion of the gain characteristic of the audio input. When the audio input level thereafter falls below the level presented by generator 4, decision circuit 5 operates within the delay or lag time of supplemental timing circuit 5a to return compandor 3 to its normally idle state of providing a compressed output gain characteristic.

In a yet more simplified embodiment of FIG. 1, where decision circuit 5 and timing circuit 5a are eliminated, the remaining circuitry can emulate the operation of a telephone carbon transmitter. Left in the circuit are electret microphone circuit 1, preconditioning circuit 2, compandor circuit 3, and linear gain level reference generator 4. The compandor is operated simply as an expandor when and only when the reference level is exceeded. Just as a carbon transmitter tends to only capture intelligible audio presented to it, low level noise is reduced in the suggested emulation circuit. It is reduced by a square law function until the audio input level causes the voltage level generator 4 to be exceeded, at which point, a linear gain characteristic is provided. Consequently, a smooth superior gain characteristic is afforded the intelligible audio input to the electret which is superior to the noise and distortion characteristics of a carbon transmitter.

Figure 2:
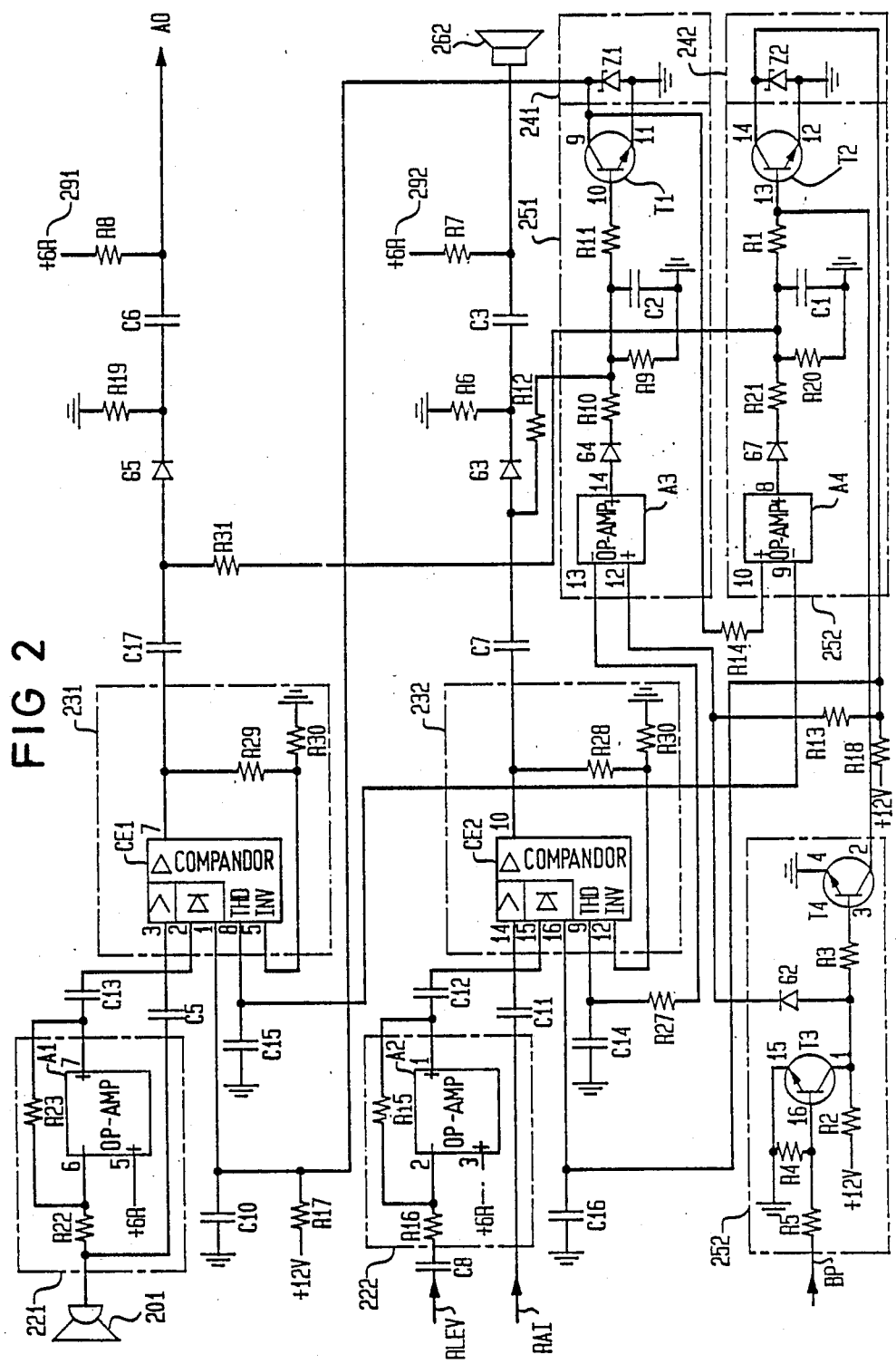
FIG. 2 is a detailed schematic drawing showing the simplified embodiment of FIG. 1 implemented in a loudspeaking telephone with hands-free operation.

The simple block schematic diagram of FIG. 1 is shown in particular detail in FIG. 2. While the implementation of the concepts of FIG. 1 may be appropriate for embodiment in a hearing aid application, FIG. 2 represents the embodiment of FIG. 1 implemented in a loudspeaking telephone set. Two separate and distinct circuits, as depicted in FIG. 1, are represented in detail in FIG. 2. While one such circuit is implemented in the transmit direction between the microphone of the loudspeaking telephone and the far end, a second such circuit is implemented in the audio reception path from a far end telephone to a speaker of the loudspeaking telephone at the near end. Dual circuit implementation in practically a mirror image relationship provides a balancing of the transmit and receive paths of the transmission channel. Also, three states of operation are possible as will be hereinafter described in detail. Furthermore, in a preferred embodiment of a loudspeaking telephone, there is shown in FIG. 2 a dial signaling preemption circuit 252 for forcing the loudspeaker compandor 232 at the near end to broadcast confirmation and other tone dialing signals at the loudspeaker of the loudspeaking telephone.

Three states of operation are provided in the present invention instead of two as disclosed in the Reid and Breeden telephones of the prior art. There is no default direction of transmission nor does control reside with the last source of audio signal until switched. Rather neither end has control during an idle condition. When one end has control, it is because audio signal is present at a level above the reference level provided by the reference level generator. The three states of operation then are idle, near end control and far end control.

Attack and lag times are fast in the present embodiment, but, to eliminate competition between whether the near end source controls or the far end, the attack time for near end control is set slightly faster by appropriate choice of resistors R17 and R18, R17 being of a larger value than R18, capacitors C10 and C16 having the same value. Although not shown in FIG. 2, capacitor C10 and resistor R17 may be considered a part of decision circuit 251, just as capacitor C16 and resistor R18 may be considered a part of decsision circuit 252. Lag time does not need to be set differently for near or far end control, lag time only being related to how quickly control is relinquished to either the idle state of operation or to the far end.

While during the normally idle or first state of operation the compressed gain characteristic applied to the input signal may be applicable to the loudspeaker for broadcast, the channel is almost silent. Consequently, the embodiment may include an intentional discontinuity, a feedback path from the microphone, or other noise source so that the user of the loudspeaking telephone of FIG. 2 appreciates that the loudspeaking telephone is turned on. In the particular embodiment of FIG. 2, there is a noisy reference voltage source 291, 292 provided in both transmission paths through a noise level dropping resistor R8 and R7 respectively. The direct current voltage is blocked by blocking capacitors C6 and C3 from the rest of the loudspeaking telephone circuitry.

Now that a generalized description of the features of the embodiment of FIG. 2 have been provided, a more particularized description of the operation of the circuitry of FIG. 2 follows. First will be described the operation of the circuit when an intelligible audio signal is provided by electret microphone circuit 201.

Preconditioning circuit 221 comprises most simply an operational amplifier such as a National 324 opamp having a gain represented by the ratio of resistors R23 and R22. The output of the opamp and the audio input are presented through blocking capacitors C13 and C5 to pins 2, 3 of compandor circuit CE1, respectively. The higher input level is transmitted from pin 1 of compandor CE1 through a preemptive timing circuit comprising capacitor C10 and R17 toward reference gain level generator circuit 241 which most simply comprises an appropriately chosen Zener diode Z1. The higher voltage that is provided at pin 1 of compandor CE1 than was provided previously is also provided at Zener diode Z1 and pin 9 of switching transistor T1.

That higher voltage level is also provided through resistor R14 to pin 10 of voltage comparator amplifier A4 which also may be a National 324 opamp. The higher voltage at pin 10 is compared with a reference voltage provided from pin 8 of compandor CE1 to pin 9 of opamp A4. The voltages are compared and, within an attack time governed by R21 and C1, the higher voltage output is provided at the output of capacitor C17 of compandor circuit CE1 through resistor R31. This voltage in turn is high enough to actuate switching diode G5. In this manner the audio input signal is transmitted via ouput pin 7 of compandor CE1 through capacitor C17 toward the far end of the transmission channel on lead A0.

Also, through resistor R1, transistor T2 switches on providing a conductive path to ground bringing down the voltage on pin 16 of compandor CE2, thus forcing it to be turned off.

In a similar manner intelligible audio from the far end can assume control of the present voice switched gain system. Preconditioning circuit 222 has a gain that is set by resistors R15 and R16. Capacitor C8 provides direct current blocking for opamp A2 which is most conveniently a National 324 opamp. If desired, volume control can be added between the RLEV and RAI received level inputs typically from the far end to compandor CE2. Blocking capacitors C12 and C11 are provided as described before on the conditioned and unconditioned inputs to pins 15 and 14 respectively of compandor CE2. An operate time of compandor CE2 is set slightly slower than that of compandor CE1 to preclude competition with the near end for control by choice of resistor R18 of the output on pin 16 of compandor CE2 which is presented at Zener Z2. A higher voltage at pin 16 of compandor CE2 is provided also through resistor R13 to pin 12 of operational amplifier A3 operating as a voltage comparator. Opamp A3 is also most conveniently a National 324 opamp. The output of opamp A3 being high, turns on diode G3 permitting the audio input from the far end to be transmitted at loudspeaker 262.

Returning to the idle state from either near or far end control will be described only in reference to the relinquishment of near end control. When the received volume from electret microphone circuit 201 drops from a previously high level so does the level at pin 1 of compandor CE1. That lower voltage passed through resistor R14 is compared at pin 10 of comparator amplifier A4 with a higher voltage on pin 9 and so switches low. A lag or decay time is set by the discharge time of capacitor C1 through resistor R20 to ground. This discharge of voltage in turn brings down diode G5 so that there is no signal transported toward the far end except noise from noise source 291. Of course, the loudspeaker 262 is already switched off in both the idle state and for near end audio microphone 201 control.

Dial preemption circuit 252 will now be described in particular detail. Inputs RLEV and RAI, which during a telephone conversation provide speech signals from the far end, during dialing operations provide in the present embodiment the user audible indication signals of a pushbutton dial, not shown, toward compandor circuit 232. Button push lead BP is low when a dial address signal is generated by the push of a button of the push button dial. Transistor T3 is turned off by the low button push signal. It forces compandor CE2 at pin 16 through a path including resistor R13 and diode G2. It also forces the compandor CE2 by operating opamp A3 so that within an attack time set by resistor R10 and capacitor C2 diode G3 is switched on. Also, transistor T1 is switched on insuring that pin 1 of compandor CE1 is low and compandor CE1 turned off.

At the same time, through transistor T4 any previous bias of transistor T2 is eliminated to ground. Over a path, not shown, the dial address signals are transmitted toward the far end to provide address information to a switch.

It is believed that the above-described embodiments of the present invention are merely illustrative of the principles of the invention and that other arrangements may be devised by those skilled in the art without departing from the scope and spirit of the invention.

What is claimed is:

1. A voice switched gain system for an audio reception and transmission system including an electret microphone transducer, the system comprising a source of audio signals for transduction by the electret microphone to provide transduced audio signals, a controlled compandor circuit for compressing or expanding the transduced audio signals from the audio signal source in accordance with a two state control signal, the control signal provided by a decision circuit for comparing the transduced audio signals with a predetermined gain characteristic reference level, the decision circuit switching the control signal to a first state from a second state after a predetermined attack time when the transduced audio signal level exceeds the reference level, the control signal being continuously provided in the first state until the time passage of a predetermined delay time after the audio signal level falls below the reference level when the control signal is switched back to the second state, the control signal in the second state actuating the compandor circuit to compress the gain characteristic of the transduced audio input signal and provide a compressed signal at an output of the compandor circuit and the control signal in the first state activating the compandor circuit to expand the gain characteristic of the transduced audio input signal and provide an expanded signal at the output of the compandor circuit.

2. A voice switched gain system for a loudspeaking telephone including an electret microphone, the system comprising first and second voice switch gain circuits for providing three states of operation of the loudspeaking telephone, the voice switched gain system being connected at a near end of a transmission channel having an audio source at a far end, a first, nonpre-emptive, idle state wherein neither an audio source at the loudspeaking telephone controls audio signal transmission nor does the audio source at the far end of the transmission channel to the loudspeaking telephone control audio signal transmission, a second, preemptive state where the audio source at the near end controls audio signal transmission, and a third, preemptive state where the audio source at the far end controls audio signal transmission, the first and second voice switched gain circuits each comprising: a controlled compandor connected in series with the transmission channel, a decision circuit and a reference gain level generator, the decision circuit providing a two state control signal for controlling the activation of the compandor to perform an expansion of an input signal and provide an expanded signal at its output when an input signal level presented to the compandor exceeds a level provided by the reference gain level generator; the first voice switched gain circuit effectuating the second preemptive state and, the second voice switch gain circuit effectuating the third state, each controlled compandor being switched off and providing no gain in the transmission channel during the first, non-preemptive idle state.

3. A voice channel switched gain system as recited in claim 2 further comprising a dial preemption circuit, the dial preemption circuit preempting the operation of the system and controlling first and second compandor circuits of the first and second voice switched gain circuits respectively so that a dialing indication signal is broadcast by the loudspeaking telephone.

4. A voice switched gain system as recited in claim 2 wherein the decision circuits of each voice switched gain circuit comprise a voltage comparator amplifier, a timing means and a switching transistor actuated when a predetermined reference gain level of the reference gain level generator is exceeded, the timing means comprising a timing circuit being electrically connected between the voltage comparator amplifier and the switching transistor and comprising a means for establishing a predetermined attack time for intentionally delaying operation of the associated compandor of the respective voice switched gain circuit.

5. A voice switched gain system as recited in claim 4, each timing means of the associated decision circuit further comprising a timing circuit, each timing circuit having a different predetermined attack time.

6. A carbon transmitter emulation circuit for a telephone, the emulation circuit having an idle state, a square law state and a linear gain state of operation, the emulation circuit comprising an electret microphone circuit for providing an output, an audio preconditioning circuit for conditioning the output of the electret microphone circuit, a controlled compandor circuit, and a reference gain level generating circuit, the emulation circuit being in the linear gain state for expanding audio input signals presented to it when the level of the output of the electret microphone circuit exceeds a reference gain level output of the reference gain level generating circuit, the controlled compandor circuit effectuating the audio input signal expansion in a linear manner.

* * * * *